United States Patent
He et al.

(10) Patent No.: US 11,934,252 B2
(45) Date of Patent: Mar. 19, 2024

(54) SHALLOW HIBERNATE POWER STATE

(71) Applicant: Micron Technology, Inc., Boise, ID (US)

(72) Inventors: Deping He, Boise, ID (US); Nadav Grosz, Broomfield, CO (US); Jonathan S. Parry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/648,394

(22) Filed: Jan. 19, 2022

(65) Prior Publication Data

US 2022/0300061 A1 Sep. 22, 2022

Related U.S. Application Data

(60) Provisional application No. 63/162,140, filed on Mar. 17, 2021.

(51) Int. Cl.
G06F 1/32 (2019.01)
G06F 1/3234 (2019.01)
G06F 1/3287 (2019.01)

(52) U.S. Cl.
CPC .......... *G06F 1/3275* (2013.01); *G06F 1/3287* (2013.01)

(58) Field of Classification Search
CPC .............................. G06F 1/3275; G06F 1/3287
See application file for complete search history.

(56) References Cited

U.S. PATENT DOCUMENTS

| | | |
|---|---|---|
| 2015/0241952 A1 | 8/2015 | Asami et al. |
| 2017/0068308 A1 | 3/2017 | Park et al. |
| 2017/0115916 A1 | 4/2017 | Jayachandran et al. |
| 2018/0301183 A1 | 10/2018 | Bacchus et al. |
| 2018/0335970 A1* | 11/2018 | Chen ....................... G11C 5/145 |
| 2021/0018975 A1 | 1/2021 | Liang et al. |

OTHER PUBLICATIONS

Wikipedia, "ACPI", retrieved from the internet at <https://web.archive.org/web/20201112042721/https://en.wikipedia.org/wiki/ACPI>, 10 pages (Year: 2020).*
European Patent Office, "European Search Report and Search Opinion", issued in connection with European Patent Application No. 22162613.8 dated Aug. 18, 2022 (11 pages).

* cited by examiner

*Primary Examiner* — Stefan Stoynov
(74) *Attorney, Agent, or Firm* — Holland & Hart LLP

(57) ABSTRACT

Methods, systems, and devices for shallow hibernate power state are described. A memory system may include a memory array and a controller. The memory system may transition from a first power state having a first current to a second power state having a second current less than the first current, where the first power state is associated with executing received commands and the second power state is associated with deactivating one or more components of the memory array. The memory system may initiate a timer after transitioning from the first power state to the second power state. The memory system may determine the timer satisfies a threshold and transition from the second power state to a third power state having a third current less than the second current based on the timer satisfying the threshold.

24 Claims, 5 Drawing Sheets

SHALLOW HIBERNATE POWER STATE

CROSS REFERENCE

The present application for patent claims the benefit of U.S. Provisional Patent Application No. 63/162,140 by H E et al., entitled "SHALLOW HIBERNATE POWER STATE," filed Mar. 17, 2021, assigned to the assignee hereof, and expressly incorporated by reference herein.

FIELD OF TECHNOLOGY

The following relates generally to one or more systems for memory and more specifically to shallow hibernate power state.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
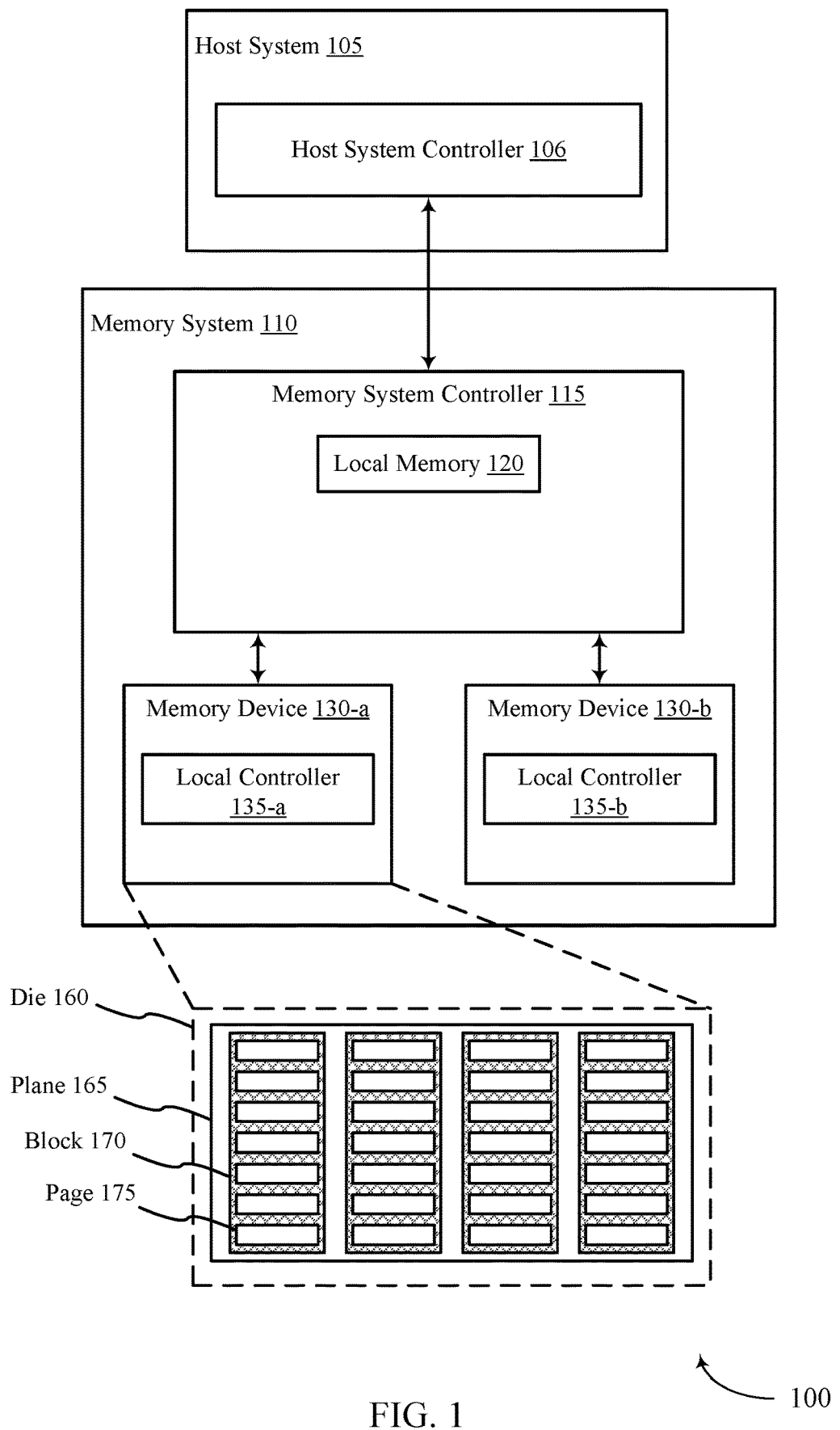
FIG. 1 illustrates an example of a system that supports shallow hibernate power state in accordance with examples as disclosed herein.

A system may include a memory system and a host system coupled with the memory system. The host system may transmit commands to the memory system. In some examples, the memory system may be in a first power state—e.g., an active power state where the memory system may utilize a relatively high amount of power to execute operations received from the host system or background operations associated with the commands. Some host systems have procedures to conserve power in response to the host system not actively working. In some examples, the host system may be in an idle state and may refrain from transmitting any commands to the memory system—e.g., the host system may not have any operations to perform. In such examples, the memory system may transition from the first power state to a second power state that consumes less power than the first power state—e.g., the memory system may transition to the second power state to conserve power in response to there being a lack of commands coming from the host system (e.g., a command queue of the memory system is empty). Some systems are battery-powered such that both the host system and the memory system are powered by a battery. In such systems, reducing power consumption in both the host system and the memory system may provide benefits to the user and extend the overall battery life of the system. In some examples, the host system may enter a sleep mode—e.g., the host system may enter a low power mode that reduces its power consumption while still retaining data. In such examples, the memory system may transition to a third state that consumes less power than the first power state and the second power state—e.g., the memory system may enter a power saving mode in response to the host system being in a sleep mode.

In some cases, the host system may enter the idle mode for a relatively long time—e.g., the host system may be idle for several seconds. In such examples, the memory system may consume excess power by remaining in the second power state throughout the duration of the host system's idle mode—e.g., if the duration of the idle mode is relatively long, the memory system may conserve more power by transitioning to the third power state instead of the second power state. In other examples, the host system may enter the idle mode for a relatively short time—e.g., the host system may be idle for a few microseconds. In such examples, the memory system may have a reduced latency by remaining in the second power state—e.g., if the memory system transitioned to the third power state instead of the second power state while the host system is idle, the memory system may take longer to transition back to the first power state and become active. That is, there may be tradeoffs between power consumption and latency in response to the memory system being in the second or third power state.

It may be desirable to have the memory system operate in an intermediate power state (e.g., a third power state) in response to the host system being idle. An intermediate power state may allow the memory system to conserve power, but still respond to host commands in a relatively short duration of time. In some cases, the intermediate power state may include clock gating, deactivating some oscillators, and putting a cache memory of the memory system into a sleep state.

Systems, techniques, and devices are described herein for a memory system to dynamically transition between various power consumption states (e.g., voltages or levels) based on a host system performance, a link speed, or a host system configuration. For example, the memory system may transition from the first power state to the second power state in response to the host system being an idle mode. The memory system may then initiate a first timer and transition to a fourth power state (e.g., a power state between the second power state and the third power state) in response to the timer satisfying a first threshold. The memory system may then initiate a second timer and transition to the third power state in response to the second timer satisfying a second threshold. In some cases, the memory system may configure the first threshold and the second threshold based on the host system performance, the link speed, or a host system request. By transitioning between the second power state, the third power state, and the fourth power state dynamically, the memory system may reduce power consumption and latency. For example, the memory system may reduce latency and be able to quickly transition from the second power state or the fourth power state to the first power state in response to the host system exiting idle mode quickly. In other examples, the memory system may conserve power by transitioning to the third power state in response to the host system being in the idle mode for a relatively long time.

Features of the disclosure are initially described in the context of systems, devices, and circuits with reference to FIG. 1. Features of the disclosure are described in the context of a state diagram and timing diagram with reference to FIGS. 2 & 3. These and other features of the disclosure are further illustrated by and described in the context of an apparatus diagram and a flowchart that relate to shallow hibernate power state with reference to FIGS. 4 & 5.

FIG. 1 illustrates an example of a system 100 that supports shallow hibernate power state in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support shallow hibernate power state. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some examples, the memory system 110 may utilize multiple power states depending on the commands and instructions received from the host system 105. For example, the memory system 110 may be in an active mode and have components active while executing commands received from the host system 105. In other examples, the memory system 110 may be in a power saving state based on the host system initiating a sleep procedure—e.g., the host system 105 may reduce power consumption and deactivate a power supply to peripheral components. In other examples, the memory system 110 may be in an intermediate power state based on the host system 105 being idle—e.g., unused by a program or user. The memory system 110 may be able to transition back to the active mode faster from the intermediate power mode than the power saving mode but may also consume more power being in the intermediate power mode than being in the power savings mode. That is, the memory system may experience tradeoffs between power consumption and latency.

As described herein, the memory system 110 may utilize dynamic power states while the host system 105 is idle based on host system 105 performance and power targets. For example, the memory system 110 may transition to a first power state in response to the host system 105 entering the idle state. The memory system 110 may initiate a first timer when entering the first power state and transition to a second power state having a lower current in response to the first timer satisfying a first threshold. In some examples, the memory system 110 may initiate a second timer when entering the second power state and transition to a third power state having a lower current than the second power state in response to the timer satisfying a second threshold. That is, the memory system may gradually transition to the third power state mode associated with a power saving mode of the memory system 110. This may enable the memory system 110 to quickly transition back to the active mode in response to a command being received while the memory system 110 is in the first power mode and the second power mode while also allowing the memory system 110 to conserve power in the third power state—e.g., the memory system 110 may conserve power over long durations of idleness while still maintaining performance if the idle duration is short.

Figure 2:
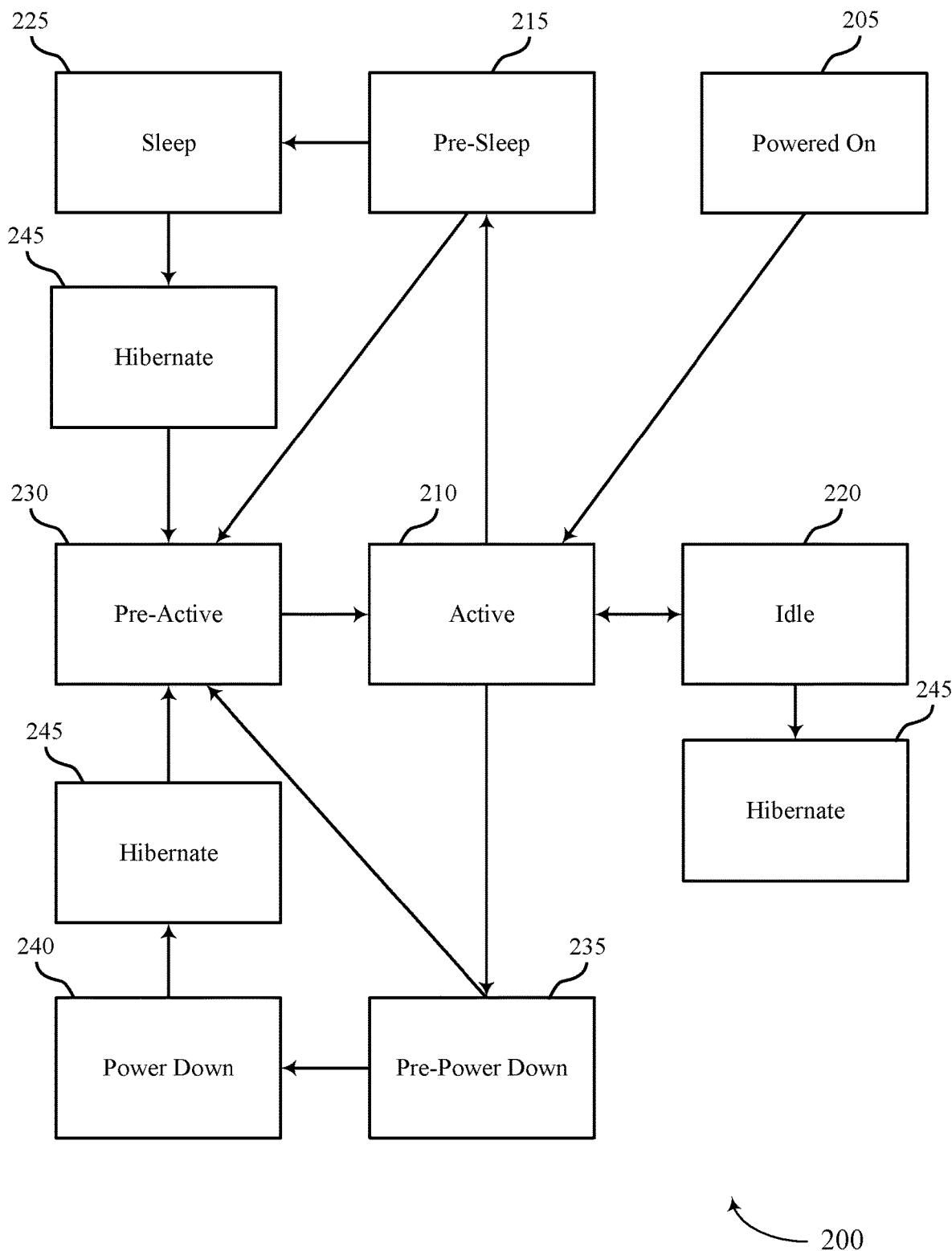
FIG. 2 illustrates an example of a state diagram that supports shallow hibernate power state in accordance with examples as disclosed herein.

FIG. 2 illustrates an example of a state diagram 200 that supports shallow hibernate power state in accordance with examples as disclosed herein. The state diagram 200 may illustrate possible power states of a memory system (e.g., memory system 110 as described with reference to FIG. 1) that may be utilized and transition between. In some examples, the state diagram may be an example of a power mode state machine of a UFS device. The state diagram 200 illustrates power states such as powered on 205, active 210, pre-sleep 215, idle 220, sleep 225, pre-active 230, pre-power down 235, power down 240, and hibernate 245. In some examples, the state diagram 200 may illustrate possible power states for a UFS memory system.

In some examples, a memory system may be configured to be in a powered on state 205. The memory system may start an initialization procedure in response to being in the powered on state 205. For example, the memory system may enter the powered on state 205 in response to a power supply being coupled with the memory system—e.g., in response to a host system (e.g., host system 105 as described with reference to FIG. 1) activating the memory system. In such examples, the memory system may begin initializing the memory device (e.g., memory device 130 as described with reference to FIG. 1) for use. In some examples, the memory system may transition to the active state 210 after completing the initializing procedure in the powered on state 205.

In some cases, the memory system may be configured to be in an active state 210. For example, the memory system may execute commands received from the host system or background operations associated with data maintenance or the commands received from the host system. In some cases, the memory system may be supplied a relatively high amount of power while in the active state 210—e.g., the host system may provide the most power to the memory system while the memory system is in the active state 210. In some examples, the memory system may transition to a pre-sleep state 215, idle state 220, or a pre-power down state 240 from the active state 210.

In some instances, the memory system may be configured to be in a pre-sleep state 215. The memory system may begin to transition to a sleep state 225 in response to being in the pre-sleep state 215. For example, the memory system may begin to power off components—e.g., stopping clocks in the memory system controller (e.g., memory system controller 115 as described with reference to FIG. 1). In some examples, the memory system may transition from the active state 210 to the pre-sleep state 215 based on receiving a start stop unit (SSU) command—e.g., a command from the UFS protocol. In other examples, the memory system may transition from the active state 210 to the pre-sleep state 215 based on reading a value from a register—e.g., reading a zero (0) in the bInitpowermode field of the register. The memory system may transition to the sleep state 225 after completing the transition in the pre-sleep state 215 or transition to the pre-active state 230 from the pre-sleep state 215 based on receiving an SSU command.

In some instances, the memory system may be configured to be in a pre-active state 230. For example, the memory system may begin to power on components—e.g., powering on a clock of the memory system controller. In some cases, the memory system may transition to the active state 210 after completing the operations of the pre-active state 230.

In some examples, the memory system may be configured to be in the sleep state 225. In some examples, the memory system may consume less power in the sleep state 225—e.g., by gating clocks and deactivating an oscillator in the memory system controller. In some examples, the memory system controller may stay powered while in the sleep state 225. In some cases, memory system may transition to the pre-active state 230 based on receiving an SSU command. In some examples, the memory system may be configured to enter a hibernate state 245 in response to transitioning from the sleep state 225 to the pre-active state 230. In some examples, the memory system may be configured to enter a hibernate state 245 in response to being in an idle state.

In some instances, the memory system may be configured to be in the pre-power down state 235. For example, the memory system may begin to power down components or transfer data from one location to another to prepare for the power down state 240—e.g., transferring data from the memory system controller to a memory device to retain the data. That is, the memory system may transfer data stored at the SRAM of the memory system controller to the memory devices. The memory system may transition to the power down state 240 after executing the operations associated with the pre-power down state 235.

In some cases, the memory system may be configured to be in the power down state 240. For example, the memory system may power off the memory system controller, clocks in the memory system, and turn off logic circuits (e.g., CPUs) in the power down state 240. The memory system may consume the least amount of power in the power down state 240. In some examples, the memory system may transition from the power down state 240 to the pre-active state 230 based on receiving an SSU command. In some example, the memory system may be configured to enter the hibernate state 245 in response to transitioning from the power down state 240 to the pre-active state 230.

In other examples, the memory system may be configured to be in an idle state 220. For example, the memory system may be in the idle state in response to not performing commands or operations—e.g., after finishing the received commands from the host system. The memory system may transition between the idle state 220 and the active state 210 based on receiving a command or performing an operation. In some cases, the memory system may consume excess power in the idle state 220—e.g., the memory system may be at a power state that consumes more power than the sleep state 225 or the power down state 240. In other examples, the memory system may have increased latency in response to transitioning between the idle state 220 and the active state 210—e.g., the memory system may be at a power state similar to the sleep state 225 or the power down state 240 and take longer to transition back to the active state 210. That is, the memory system may perform the operations of the pre-active state 230 and take longer to transition between the idle state 220 and the active state 210 in response to the power consumption in the idle state 220 being low.

As described herein, the memory system may transition to a dynamic hibernate state 245 from the idle state 220. The hibernate state 245 may be associated with a lower power consumption than the active state 210. The hibernate state 245 may also enable the memory system to quickly transition to the active state 210 in response to the duration of the idle state 220 being relatively short. For example, the memory system may be configured to utilize multiple power levels (e.g., voltages) while in the hibernate state 245. In some examples, the memory system may transition to lower voltages based on timer thresholds in response to the duration of the idle state 220 being relatively long as described with reference to FIG. 3. In other examples, the memory system may still be at a higher voltage in response to a new command being received from the host system and the memory system may quickly transition back to the active state 210 and avoid additional latencies as described with reference to FIG. 3. By utilizing a dynamic hibernate state, the memory system may reduce power consumption and avoid latency tradeoffs in response to the duration of the idle state 220 being short.

Figure 3:
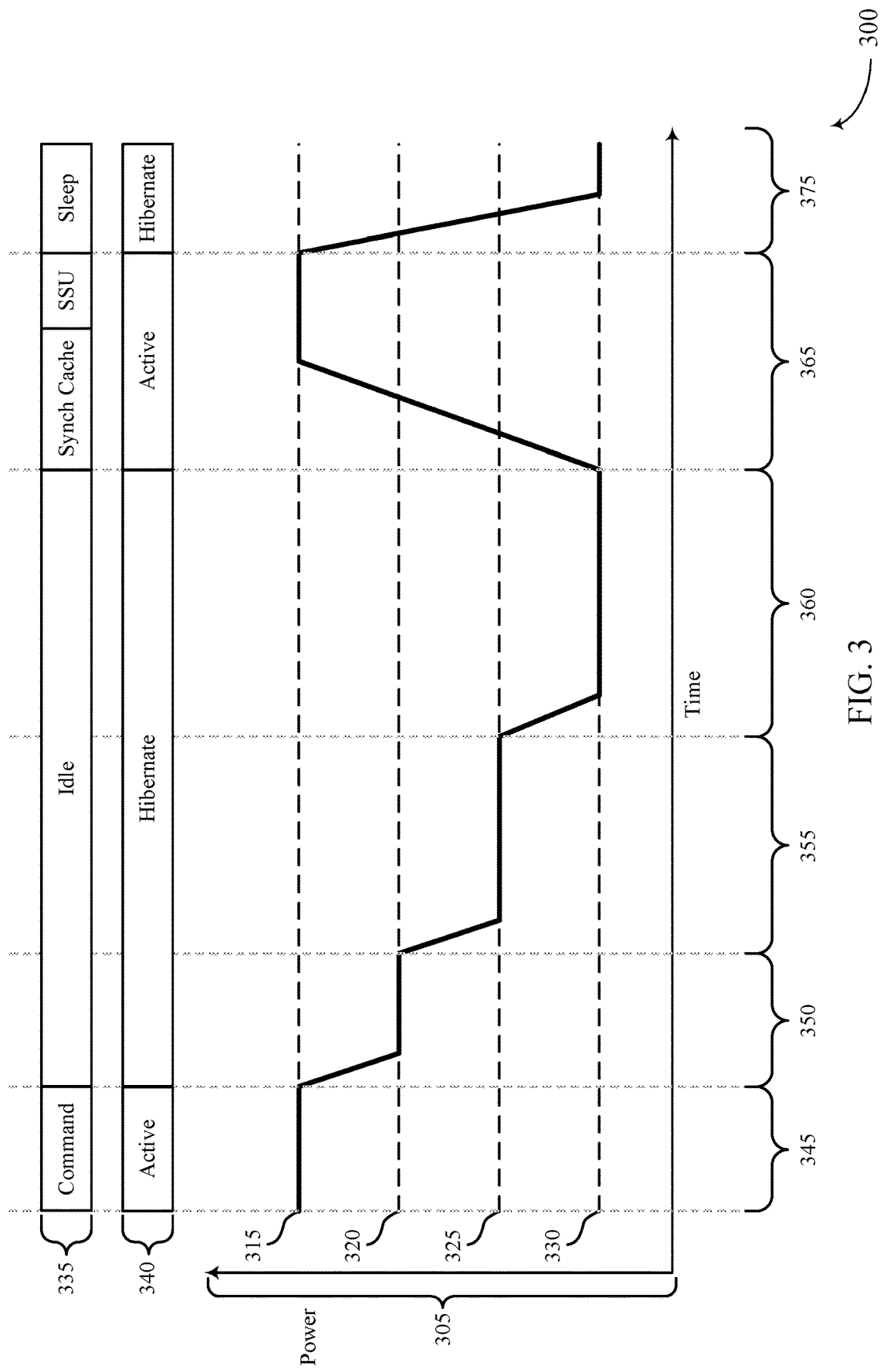
FIG. 3 illustrates an example of a timing diagram that supports shallow hibernate power state in accordance with examples as disclosed herein.

FIG. 3 illustrates an example of a timing diagram 300 that supports shallow hibernate power state in accordance with examples as disclosed herein. Timing diagram 300 may illustrate a power state (e.g., power voltage or power level) of a memory system (e.g., memory system 110 as described with reference to FIG. 1) as the memory system enters an idle state (e.g., idle state 220 as described with reference to FIG. 2). The timing diagram 300 may illustrate a plot 305 of power consumption of a memory system coupled with a host system. The plot 305 shows power (e.g., y-axis) over time (e.g., x-axis). The timing diagram 300 may also include a state 335 or command associated with a host system (e.g., host system 105 as described with reference to FIG. 1) and a state 340 of a communication link or conductive path between the memory system and the host system—e.g., a state of a UniPro interface coupling the memory system and the host system, or a memory system controller (e.g., memory system controller 115 as described with reference to FIG. 1) and a memory device (e.g., memory device 130 as described with reference to FIG. 1). The timing diagram 300 may illustrate the memory system in a first power state 315, a second power state 320, a third power state 325, and a fourth power state 330.

At a time 345, the host system and the communication link may be in an active state that includes sending and receiving commands and a memory system may be in a first power state 315. In some examples, the memory system may be executing a command or an operation received from a host system—e.g., the memory system may be executing a read command, a write command, or a refresh command. In some cases, the first power state 315 may also be referred to as an active state—e.g., the memory system may be actively executing commands and operations. The memory system may also have some or all its components activated during the first power state 315—e.g., the memory system controller, clocks, oscillators, logic circuits may be activated. The memory system may be configured to use a relatively high amount of current and power to execute the operations and commands in the first power state 315—e.g., the memory system may utilize more power to execute the commands and operations than in response to being in a power saving mode. For example, the memory system may utilize 180 milliamps (mA) or more of current in response to being in the first power state 315. In some examples, the communication link between the host system and the memory system (e.g., the UniPro interface) may also be in an active state.

At a time 350, the host system may transition to an idle state, the communication link may transition to a hibernate state, and the memory system may transition to a second power state 320. In some examples, a host system may enter an idle mode. That is, the host system may not be initiating any new commands or operations for the memory system—e.g., the host system may not be used by a program or user. In such examples, the communication link between the host system and the memory system may be in a hibernate state—e.g., a low power saving mode or a mode where the communication link conserves power until a new command is issued. In some cases, the memory system may transition from the first power state 315 to a second power state 320 based on detecting the host system and communication link being in the idle and hibernate states, respectively—e.g., the memory system controller may detect a lack of incoming commands and transition to the second power state 320 based on the lack of incoming commands. In some examples, the second power state 320 may have a current less than the first power state 315 and may be an example of L1 power state—e.g., the memory system may utilize less power in the second power state 320. For example, the memory system controller may initiate clock gating in the second power state 320—e.g., the memory system may decouple clock signals to the memory system controller to reduce power. In such examples, the memory system may utilize less current in the second power state 320 than the first power state 315—e.g., 60 mA in the second power state 320. The memory system controller may also initiate a first timer in response to transitioning from the first power state 315 to the second power state 320. That is, the first timer may determine an amount of time in the second power state 320. In some examples, the memory system may receive a command from the host system while in the second power state 320. That is, although not shown in the timing diagram 300, in some examples the host system may have a short idle period and initiate a command while the memory system is in the second power state 320. In such examples, the memory system may transition back to the first power state 315 and execute the command.

At a time 355, the memory system may be in a third power state 325 (which may be an example of an intermediate power state as described herein). In some examples, the memory system controller may determine the first timer satisfies a first threshold. In such examples, the memory system controller may transition from the second power state 320 to the third power state 325. In some cases, the first threshold used to enter the third power state 325 may be configurable. For example, the memory system may configure the first threshold based on a host performance target (e.g., power performance target) or based on a link communication target (e.g., a link speed). That is, the memory system controller may configure a longer first threshold if the host performance or link communication targets (e.g., expected latency for the memory system to execute command after the command is issued by the host system) are high and a shorter first threshold if the host performance or link communication targets are low. For example, the memory system may stay in the second power state 320 longer to transition to the first power state 315 quicker if a command is received from the host system and the performance target is high. An example first threshold may be between zero (0) and five (5) microseconds (µs). In some examples, the third power state 325 may consume less power than the second power state 320 and may be an example of L1.5 power state. In some examples, the memory system may transition the SRAM memory in the memory system controller to a sleep mode while in the third power state 325. The sleep mode of the SRAM may be a state in which data is retained but other operations are not available. Additionally, as part of the third power state, the memory system may initiate clock gating and deactivate one or more oscillators in addition to transitioning the SRAM to a sleep state. In such examples, the memory system controller may utilize less current in the third power state 325 than the second power state 320—e.g., one (1) microamp (1 µA).

In some examples, the memory system controller may also initiate a second timer in response to transitioning to the third power state 325. For example, the second timer may be used to define a length of time spent in the third power state 325 before transitioning to an even lower power state, a fourth power state 330 in which the SRAM is powered-down. In some examples, the memory system may receive a command from the host system while in the third power state 325. That is, although not shown in the timing diagram 300, in some examples the host system may have a short idle period and initiate a command while the memory system is in the third power state 325. In such examples, the memory system may transition back to the first power state 315 and execute the command.

At a time 360, the memory system controller may be at a fourth power state 330. In some examples, the memory system controller may enter the fourth power state based on determining that the second timer satisfies a second threshold. In such examples, the memory system controller may transition from the third power state 325 to the fourth power state 330. In some cases, the second threshold may be configurable. For example, the memory system may configure the second threshold based on a host performance target (e.g., power performance target) or based on a link communication target (e.g., a link speed). That is, the memory system controller may configure a longer second threshold if the host performance or link communication targets are high and a shorter second threshold if the host performance or link communication targets are low—e.g., the memory system may stay in the third power state 325 longer to transition to the first power state 315 quicker if a command is received from the host system and the performance target is high. In some examples, the memory system may also configure the second timer based on reading a value from a register written to by the host system. For example, the host system may determine a duration of the second threshold and write a value to the register to indicate the duration to the memory system. In some cases, the host system may disable the second timer entirely. In such examples, the memory system may transition directly from the second power state 320 to the fourth power state 330—e.g., the memory system controller may transition from the second power state 320 to the fourth power state 330 at a time 355. An example of a second threshold may be 100 microseconds (ms).

In some examples, the fourth power state 330 may consume less power than the third power state 325 and may be an example of L2 power state. In some examples, the memory system may transition the SRAM of the memory system into a powered down state. Before powering-down the SRAM (e.g., cache memory), the memory system may transfer any information in the SRAM into the NAND. Later, in response to exiting the fourth power state 330, the memory system may transfer the saved data back to the SRAM from the NAND. As such, if the host system sends a command while the memory system is in the fourth power state 330, the duration before executing the command may be greater due to transferring information from the NAND to the SRAM. Additionally or alternatively, the memory system may initiate clock gating and deactivate the oscillator in addition to transitioning the memory system controller to a powered down mode. In some cases, the memory system may also deactivate logic circuits in the memory system controller (e.g., deactivate the CPU). In some cases, the memory system controller may utilize less current in the fourth power state 330 than the third power state 325—e.g., 0.3 microamp (1 μA).

In some examples, the memory system may receive a command from the host system while in the fourth power state 330. That is, although not shown in the timing diagram 300, in some examples the host system may cut off the idle period and initiate a command while the memory system is in the fourth power state 330. In such examples, the memory system may transition back to the first power state 315 and execute the command. That is, the memory system may transfer data back to the memory system controller, couple the clocks, and activate the logic circuits and oscillator.

At time 365, the host system may transition to an active state for the purpose of entering a sleep state, the communication link may transition to an active state, and the memory system may transition to the first power state 315. In some examples, after an idle duration, the host system may initiate a procedure to transition to a sleep mode. That is, the host system may remain unused by a program or user and transition from the idle mode to a sleep mode to conserve additional power. In such examples, the host system may transmit a synch cache command and an SSU command to the memory system. In some cases, the communication link may also transition back to an active state to communicate the command from the host system to the memory system. In some examples, the idle duration may be configurable by the host system—e.g., the host may dynamically determine an idle period based on performance and power targets. For example, the host system may determine to remain idle for no longer than three (3) seconds before transitioning to sleep mode. In response to the command, the memory system may transition from the fourth power state 330 to the first power state 315. That is, the memory system may transfer data back to the memory system controller, couple the clocks, and activate the logic circuits and oscillator. The memory system may then execute the synch cache command and the SSU command.

At a time 375, the memory system may be in a fifth power state. In some examples, the memory system may transition from the first power state 315 to the fifth power state. The fifth power state may be associated with a power saving mode of the memory system—e.g., the host system may decouple a power supply to components of a memory array or components of the controller. That is, the host system may deactivate the voltage to the memory system—e.g., turn of a VCC voltage. At time 375, the host system may also transition to the sleep mode—e.g., enter a stand-by mode, a suspend mode, and deactivate power to peripheral components. In some examples, the communication link may also transition back to the hibernate state at time 375.

By having dynamic power states, the memory system may balance the tradeoffs between power conservation and increased latency. That is, the memory system may enter the fourth power state 330 to save power consumption but also utilize the second power state 320 and the third power state 325 to conserve power consumption and reduce a latency associated with transitioning to the first power state 315.

Figure 4:
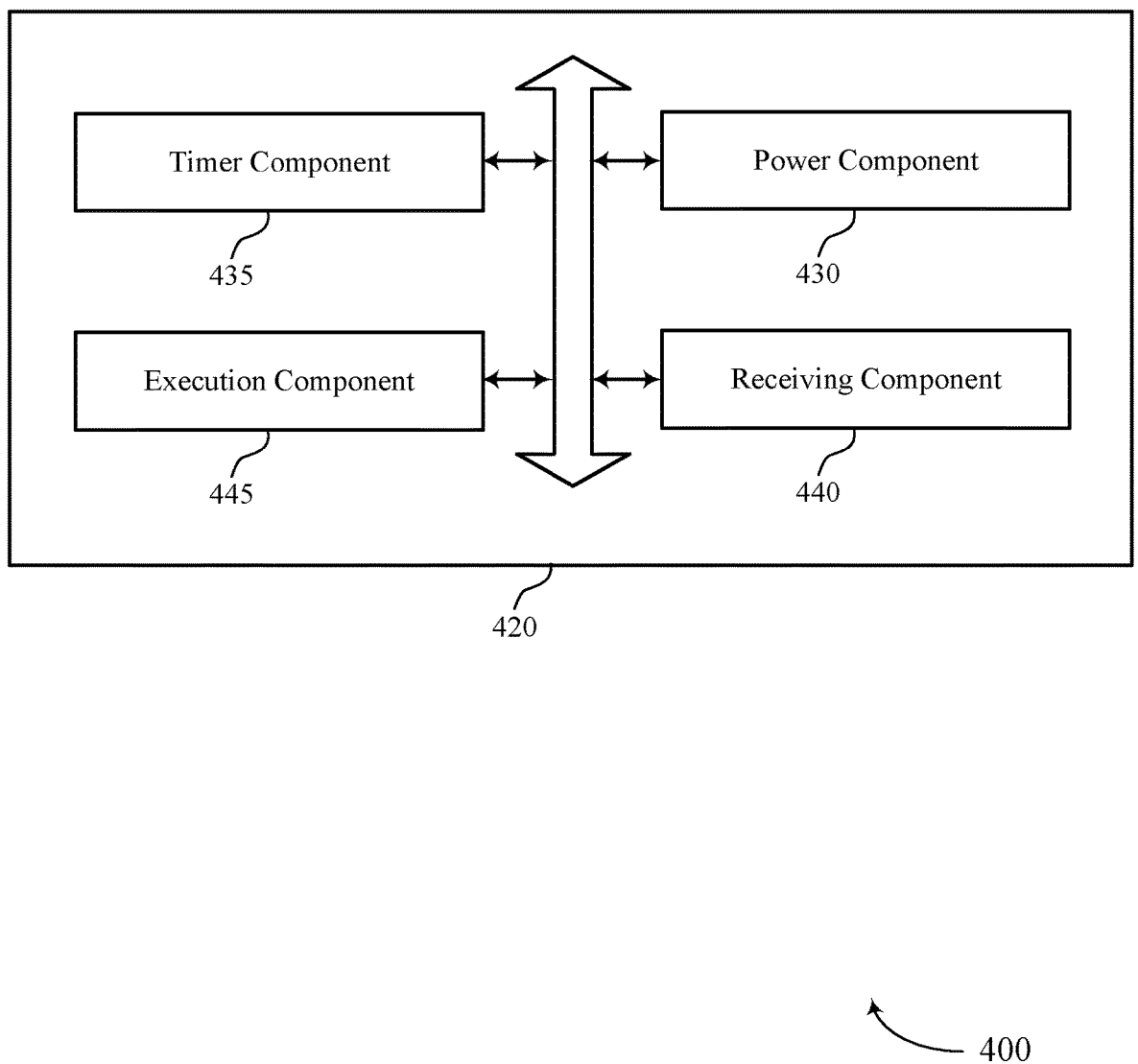
FIG. 4 shows a block diagram of a memory system that supports shallow hibernate power state in accordance with examples as disclosed herein.

FIG. 4 shows a block diagram 400 of a memory system 420 that supports shallow hibernate power state in accordance with examples as disclosed herein. The memory system 420 may be an example of aspects of a memory system as described with reference to FIGS. 1 through 3. The memory system 420, or various components thereof, may be an example of means for performing various aspects of shallow hibernate power state as described herein. For example, the memory system 420 may include a power component 430, a timer component 435, a receiving component 440, an execution component 445, or any combination thereof. Each of these components may communicate, directly or indirectly, with one another (e.g., via one or more buses).

The power component 430 may be configured as or otherwise support a means for transitioning from a first power state having a first current to a second power state having a second current lower than the first current, where the first power state is associated with executing received commands and the second power state is associated with deactivating one or more components associated with a memory array. In some examples, the power component 430 may be configured as or otherwise support a means for transitioning, based at least in part on determining the timer satisfies the threshold, from the second power state to a third power state having a third current lower than the second current.

In some examples, the power component 430 may be configured as or otherwise support a means for transitioning from the third power state to a fourth power state having a fourth current lower than the third current based at least in part on determining the timer satisfies the threshold, where the fourth power state is entered while a host system is in an idle state. In some examples, the power component 430 may be configured as or otherwise support a means for transitioning from the fourth power state to the first power state based at least in part on receiving the command. In some examples, the power component 430 may be configured as or otherwise support a means for transitioning from the first power state to a fifth power state having a fifth current equal to or less than the fourth current based at least in part on executing the command, where the fifth power state is associated with decoupling a voltage supply of components of the memory array or controller. In some examples, the power component 430 may be configured as or otherwise support a means for transitioning from the fourth power state to the first power state based at least in part on receiving the access command.

In some examples, the power component 430 may be configured as or otherwise support a means for transitioning from the first power state to the second power state after disabling the second timer. In some examples, the power component 430 may be configured as or otherwise support a means for transitioning from the second power state to the fourth power state based at least in part on determining the timer satisfies the threshold and disabling the second timer. In some examples, to support transitioning to the second power state from the first power state, the power component 430 may be configured as or otherwise support a means for decoupling a clock signal from one or more components of a controller.

In some examples, to support transitioning to the third power state from the first power state, the power component 430 may be configured as or otherwise support a means for decoupling a clock signal from one or more components the controller, deactivating an oscillator, and causing a random access memory of the apparatus to enter a sleep state. In some examples, the power component 430 may be configured to configure the threshold and the second threshold based at least in part on a power performance target of the apparatus or a link target of the apparatus. In some examples, the power component 430 may be configured as or otherwise support a means for transition from the third power state to the first power state based at least in part on receiving the access command. In some examples, the power component 430 may associate the fourth power state with the idle state of the host system associated with the apparatus. In some examples, the power component 430 may associate the first power state, the second power state, and the third power state with an idle state of a host system associated with the apparatus.

The timer component 435 may be configured as or otherwise support a means for initiating a timer based at least in part on transitioning from the first power state to the second power state. In some examples, the timer component 435 may be configured as or otherwise support a means for determining the timer satisfies a threshold based at least in part on initiating the timer. In some examples, the timer component 435 may be configured as or otherwise support a means for initiating a second timer based at least in part on transitioning from the second power state to the third power state. In some examples, the timer component 435 may be configured as or otherwise support a means for determining the second timer satisfies a second threshold based at least in part on initiating the second timer. In some examples, the timer component 435 may be configured as or otherwise support a means for disabling the second timer based at least in part on reading the value from the register.

In some examples, the timer component 435 may be configured as or otherwise support a means for initiating the timer based at least in part on transitioning from the first power state to the second power state. In some examples, the timer component 435 may be configured as or otherwise support a means for determining the timer satisfies the threshold based at least in part on initiating the timer.

In some examples, the receiving component 440 may be configured as or otherwise support a means for receiving a command associated with synchronizing a cache after transitioning from the third power state to the fourth power state. In some examples, the receiving component 440 may be configured as or otherwise support a means for receiving an access command after transitioning from the third power state to the fourth power state. In some examples, the receiving component 440 may be configured as or otherwise support a means for receive an access command after transitioning from the second power state to the third power state. In some examples, the receiving component 440 may detect a lack of incoming commands during the idle state.

In some examples, the execution component 445 may be configured as or otherwise support a means for executing the command based at least in part on transitioning from the fourth power state to the first power state. In some examples, the execution component 445 may be configured as or otherwise support a means for executing the access command based at least in part on transitioning from the fourth power state to the first power state. In some examples, the execution component 445 may be configured as or otherwise support a means for reading a value from a register while operating in the first power state. In some examples, to support transitioning to the fourth power state includes, the execution component 445 may be configured as or otherwise support a means for transferring data from a random access memory of the apparatus to the memory array and deactivating the random access memory.

Figure 5:
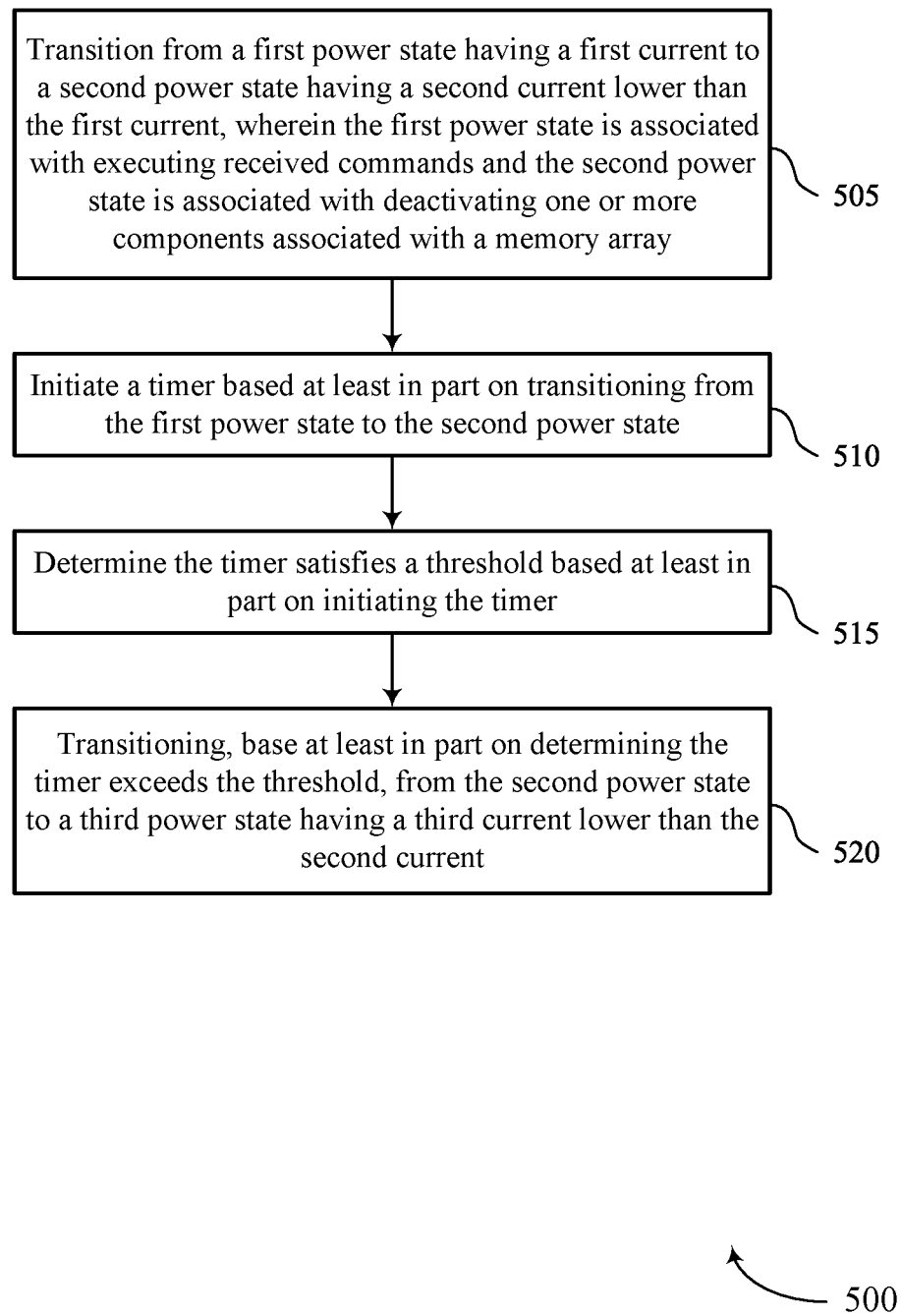
FIG. 5 shows a flowchart illustrating a method or methods that support shallow hibernate power state in accordance with examples as disclosed herein.

FIG. 5 shows a flowchart illustrating a method 500 that supports shallow hibernate power state in accordance with examples as disclosed herein. The operations of method 500 may be implemented by a memory system or its components as described herein. For example, the operations of method 500 may be performed by a memory system as described with reference to FIGS. 1 through 4. In some examples, a memory system may execute a set of instructions to control the functional elements of the device to perform the described functions. Additionally or alternatively, the memory system may perform aspects of the described functions using special-purpose hardware.

At 505, the method may include transitioning from a first power state having a first current to a second power state having a second current lower than the first current, where the first power state is associated with executing received commands and the second power state is associated with deactivating one or more components associated with a memory array. The operations of 505 may be performed in accordance with examples as disclosed herein. In some examples, aspects of the operations of 505 may be performed by a power component 430 as described with reference to FIG. 4.

At 510, the method may include initiating a timer based at least in part on transitioning from the first power state to the second power state. The operations of 510 may be performed in accordance with examples as disclosed herein. In some examples, aspects of the operations of 510 may be performed by a timer component 435 as described with reference to FIG. 4.

At 515, the method may include determining the timer satisfies a threshold based at least in part on initiating the timer. The operations of 515 may be performed in accordance with examples as disclosed herein. In some examples, aspects of the operations of 515 may be performed by a timer component 435 as described with reference to FIG. 4.

At 520, the method may include transitioning, based at least in part on determining the timer satisfies the threshold, from the second power state to a third power state having a third current lower than the second current. The operations of 520 may be performed in accordance with examples as disclosed herein. In some examples, aspects of the operations of 520 may be performed by a power component 430 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor) for transitioning from a first power state having a first current to a second power state having a second current lower than the first current, where the first power state is associated with executing received commands and the second power state is associated with deactivating one or more components associated with a memory array, initiating a timer based at least in part on transitioning from the first power state to the second power state, determining the timer satisfies a threshold based at least in part on initiating the timer, and transitioning, based at least in part on determining the timer satisfies the threshold, from the second power state to a third power state having a third current lower than the second current.

Some cases of the method 500 and the apparatus described herein may further include operations, features, circuitry, logic, means, or instructions for initiating a second timer based at least in part on transitioning from the second power state to the third power state, determining the second timer satisfies a second threshold based at least in part on initiating the second timer, and transitioning from the third power state to a fourth power state having a fourth current lower than the third current based at least in part on determining the timer satisfies the threshold, where the fourth power state may be entered while a host system may be in an idle state.

Some instances of the method 500 and the apparatus described herein may further include operations, features, circuitry, logic, means, or instructions for receiving a command associated with synchronizing a cache after transitioning from the third power state to the fourth power state, transitioning from the fourth power state to the first power state based at least in part on receiving the command, executing the command based at least in part on transitioning from the fourth power state to the first power state, and transitioning from the first power state to a fifth power state having a fifth current equal to or less than the fourth current based at least in part on executing the command, where the fifth power state may be associated with decoupling a voltage supply of components of the memory array or controller.

Some examples of the method 500 and the apparatus described herein may further include operations, features, circuitry, logic, means, or instructions for receiving an access command after transitioning from the third power state to the fourth power state, transitioning from the fourth power state to the first power state based at least in part on receiving the access command, and executing the access command based at least in part on transitioning from the fourth power state to the first power state.

In some cases of the method 500 and the apparatus described herein, the threshold and the second threshold may be configurable based at least in part on a power performance target of the apparatus or a link target of the apparatus.

Some instances of the method 500 and the apparatus described herein may further include operations, features, circuitry, logic, means, or instructions for reading a value from a register while operating in the first power state and disabling the second timer based at least in part on reading the value from the register.

Some examples of the method 500 and the apparatus described herein may further include operations, features, circuitry, logic, means, or instructions for transitioning from the first power state to the second power state after disabling the second timer, initiating the timer based at least in part on transitioning from the first power state to the second power state, determining the timer satisfies the threshold based at least in part on initiating the timer, and transitioning from the second power state to the fourth power state based at least in part on determining the timer satisfies the threshold and disabling the second timer.

In some cases of the method 500 and the apparatus described herein, transitioning to the fourth power state includes may include operations, features, circuitry, logic, means, or instructions for transferring data from a random access memory of the apparatus to the memory array and deactivating the random access memory.

In some instances of the method 500 and the apparatus described herein, the fourth power state may be associated with the idle state of the host system associated with the apparatus and the controller detects a lack of incoming commands during the idle state.

In some examples of the method 500 and the apparatus described herein, transitioning to the second power state from the first power state may include operations, features, circuitry, logic, means, or instructions for decoupling a clock signal from one or more components of a controller.

In some cases of the method 500 and the apparatus described herein, transitioning to the third power state from the first power state may include operations, features, circuitry, logic, means, or instructions for decoupling a clock signal from one or more components the controller, deactivating an oscillator, and causing a random access memory of the apparatus to enter a sleep state.

Some instances of the method 500 and the apparatus described herein may further include operations, features, circuitry, logic, means, or instructions for receive an access command after transitioning from the second power state to the third power state and transition from the third power state to the first power state based at least in part on receiving the access command.

In some examples of the method 500 and the apparatus described herein, the first power state, the second power state, and the third power state may be associated with an idle state of a host system associated with the apparatus.

It should be noted that the methods described above describe possible implementations, and that the operations and the steps may be rearranged or otherwise modified and that other implementations are possible. Further, portions from two or more of the methods may be combined.

An apparatus is described. The apparatus may include a memory array and a controller coupled with the memory array, the controller configurable to cause the apparatus to transition from a first power state having a first current to a second power state having a second current lower than the first current, where the first power state is associated with executing received commands and the second power state is associated with deactivating one or more components associated with the memory array, initiate a timer based at least in part on transitioning from the first power state to the second power state, determine the timer satisfies a threshold based at least in part on initiating the timer, and transition, based at least in part on determining the timer satisfies the threshold, from the second power state to a third power state having a third current lower than the second current.

In some instances, the controller may be further configured to initiate a second timer based at least in part on transitioning from the second power state to the third power state, determine the second timer satisfies a second threshold based at least in part on initiating the second timer, and transition from the third power state to a fourth power state having a fourth current lower than the third current based at least in part on determining the timer satisfies the threshold, where the fourth power state may be entered while a host system associated with the apparatus may be in an idle state.

In some cases, the controller may be further configured to receive a command associated with synchronizing a cache after transitioning from the third power state to the fourth power state, transition from the fourth power state to the first power state based at least in part on receiving the command, execute the command based at least in part on transitioning from the fourth power state to the first power state, and transition from the first power state to a fifth power state having a fifth current equal to or less than the fourth current based at least in part on executing the command, where the fifth power state may be associated with decoupling a voltage supply of components of the memory array or controller.

In some instances, the controller may be further configured to receive an access command after transitioning from the third power state to the fourth power state, transition from the fourth power state to the first power state based at least in part on receiving the access command, and execute the access command based at least in part on transitioning from the fourth power state to the first power state.

In some examples of the apparatus, the threshold and the second threshold may be configurable based at least in part on a power performance target of the apparatus or a link target of the apparatus.

In some cases, the controller may be further configured to read a value from a register while operating in the first power state and disable the second timer based at least in part on reading the value from the register.

In some instances of the apparatus, the controller may be further configured to cause the apparatus to transition from the first power state to the second power state after disabling the second timer, initiate the timer based at least in part on transitioning from the first power state to the second power state, determine the timer satisfies the threshold based at least in part on initiating the timer, and transition from the second power state to the fourth power state based at least in part on determining the timer satisfies the threshold and disabling the second timer.

In some examples, the controller may be further configured to transition to the fourth power state and transfer data from a random access memory of the apparatus to the memory array and deactivating the random access memory.

In some cases of the apparatus, the fourth power state may be associated with the idle state of the host system associated with the apparatus and the controller detects a lack of incoming commands during the idle state.

In some examples, the controller may be further configured to transition to the second power state from the first power state and decouple a clock signal from one or more components the memory array.

In some instances, the controller may be further configured to transition to the third power state from the first power state and decouple a clock signal from one or more components the memory array, deactivating an oscillator, and causing a random access memory of the apparatus to enter a sleep state.

In some examples, the controller may be further configured to receive an access command after transitioning from the second power state to the third power state and transition from the third power state to the first power state based at least in part on receiving the access command.

In some instances of the apparatus, the first power state, the second power state, and the third power state may be associated with an idle state of a host system associated with the apparatus.

In some cases, the apparatus may include a conductive path coupled with the memory array and the controller, where the first power state, the second power state, and the third power state may be associated with a hibernate state of the conductive path.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a memory array;
   a controller coupled with the memory array, the controller configurable to cause the apparatus to:
   read a value from a register while operating in a first power state;
   disable a first timer based at least in part on reading the value from the register;
   transition from the first power state having a first current to a second power state having a second current lower than the first current, wherein the first power state is associated with executing received commands and the second power state is associated with deactivating one or more components associated with the memory array;
   initiate a second timer based at least in part on transitioning from the first power state to the second power state;
   determine the second timer satisfies a threshold based at least in part on initiating the second timer, wherein the threshold is configurable based at least in part on a power performance target of the apparatus or a link target of the apparatus; and
   transition, based at least in part on determining the second timer satisfies the threshold, from the second power state to a third power state having a third current lower than the second current.

2. The apparatus of claim 1, wherein the controller is further configured to cause the apparatus to:
   initiate the first timer based at least in part on transitioning from the second power state to the third power state;
   determine the first timer satisfies a second threshold based at least in part on initiating the first timer; and
   transition from the third power state to a fourth power state having a fourth current lower than the third current based at least in part on determining the first timer satisfies the second threshold, wherein the fourth power state is entered while a host system associated with the apparatus is in an idle state.

3. The apparatus of claim 2, wherein the controller is further configured to cause the apparatus to:
   receive an access command after transitioning from the third power state to the fourth power state;
   transition from the fourth power state to the first power state based at least in part on receiving the access command; and
   execute the access command based at least in part on transitioning from the fourth power state to the first power state.

4. The apparatus of claim 2, wherein the second threshold is configurable based at least in part on the power performance target of the apparatus or the link target of the apparatus.

5. The apparatus of claim 2, wherein transitioning to the fourth power state comprises transferring data from a random access memory of the apparatus to the memory array and deactivating the random access memory.

6. The apparatus of claim 2, wherein:
   the fourth power state is associated with the idle state of the host system associated with the apparatus; and
   the controller detects a lack of incoming commands during the idle state.

7. The apparatus of claim 1, wherein the controller is further configured to cause the apparatus to transition from the first power state to the second power state after disabling the first timer.

8. The apparatus of claim 1, wherein transitioning to the second power state from the first power state comprises decoupling a clock signal from one or more components of the controller.

9. The apparatus of claim 1, wherein the third power state comprises decoupling a clock signal from one or more components of the controller, deactivating an oscillator, and causing a random access memory of the apparatus to enter a sleep state.

10. The apparatus of claim 1, wherein the controller is further configured to cause the apparatus to:
    receive an access command after transitioning from the second power state to the third power state; and
    transition from the third power state to the first power state based at least in part on receiving the access command.

11. The apparatus of claim 1, the second power state and the third power state are associated with an idle state of a host system associated with the apparatus.

12. The apparatus of claim 1, further comprising:
    a conductive path coupled with the memory array and the controller, wherein the second power state and the third power state are associated with a hibernate state of the conductive path.

13. An apparatus comprising:
    a memory array;
    a controller coupled with the memory array, the controller configurable to cause the apparatus to:
    transition from a first power state having a first current to a second power state having a second current lower than the first current, wherein the first power state is associated with executing received commands and the second power state is associated with deactivating one or more components associated with the memory array;
    initiate a timer based at least in part on transitioning from the first power state to the second power state;
    determine the timer satisfies a threshold based at least in part on initiating the timer, wherein the threshold is configurable based at least in part on a power performance target of the apparatus or a link target of the apparatus; and
    transition, based at least in part on determining the timer satisfies the threshold, from the second power state to a third power state having a third current lower than the second current;
    initiate a second timer based at least in part on transitioning from the second power state to the third power state;
    determine the second timer satisfies a second threshold based at least in part on initiating the second timer;
    transition from the third power state to a fourth power state having a fourth current lower than the third current based at least in part on determining the second timer satisfies the second threshold, wherein the fourth power state is entered while a host system associated with the apparatus is in an idle state;

receive a command associated with synchronizing a cache after transitioning from the third power state to the fourth power state;

transition from the fourth power state to the first power state based at least in part on receiving the command;

execute the command based at least in part on transitioning from the fourth power state to the first power state; and transition from the first power state to a fifth power state having a fifth current equal to or less than the fourth current based at least in part on executing the command, wherein the fifth power state is associated with decoupling a voltage supply of components of the memory array or the controller.

14. A non-transitory computer-readable medium storing code comprising instructions, which when executed by a processor of an electronic device, cause the electronic device to:

read a value from a register while operating in a first power state;

disable a first timer based at least in part on reading the value from the register;

transition from the first power state having a first current to a second power state having a second current lower than the first current, wherein the first power state is associated with executing received commands and the second power state is associated with deactivating one or more components associated with a memory array;

initiate a second timer based at least in part on transitioning from the first power state to the second power state;

determine the second timer satisfies a threshold based at least in part on initiating the second timer, wherein the threshold is configurable based at least in part on a power performance target of the electronic device or a link target of the electronic device; and transition, based at least in part on determining the second timer satisfies the threshold, from the second power state to a third power state having a third current lower than the second current.

15. The non-transitory computer-readable medium of claim 14, wherein the instructions, when executed by the processor of the electronic device, further cause the electronic device to:

initiate the first timer based at least in part on transitioning from the second power state to the third power state;

determine the first timer satisfies a second threshold based at least in part on initiating the first timer; and transition from the third power state to a fourth power state having a fourth current lower than the third current based at least in part on determining the first timer satisfies the second threshold, wherein the fourth power state is entered while a host system is in an idle state.

16. The non-transitory computer-readable medium of claim 15, wherein the instructions, when executed by the processor of the electronic device, further cause the electronic device to:

receive a command associated with synchronizing a cache after transitioning from the third power state to the fourth power state;

transition from the fourth power state to the first power state based at least in part on receiving the command;

execute the command based at least in part on transitioning from the fourth power state to the first power state; and transition from the first power state to a fifth power state having a fifth current equal to or less than the fourth current based at least in part on executing the command, wherein the fifth power state is associated with decoupling a voltage supply of components of the memory array or a controller coupled with the memory array.

17. The non-transitory computer-readable medium of claim 15, wherein the instructions, when executed by the processor of the electronic device, further cause the electronic device to:

receive an access command after transitioning from the third power state to the fourth power state;

transition from the fourth power state to the first power state based at least in part on receiving the access command; and execute the access command based at least in part on transitioning from the fourth power state to the first power state.

18. The non-transitory computer-readable medium of claim 14, wherein the instructions, when executed by the processor of the electronic device, further cause the electronic device to transition from the first power state to the second power state after disabling the first timer.

19. The non-transitory computer-readable medium of claim 14, wherein the instructions, when executed by the processor of the electronic device, further cause the electronic device to:

receive an access command after transitioning from the second power state to the third power state; and transition from the third power state to the first power state based at least in part on receiving the access command.

20. A method, comprising:

reading a value from a register while operating in a first power state;

disabling a first timer based at least in part on reading the value from the register;

transitioning from the first power state having a first current to a second power state having a second current lower than the first current, wherein the first power state is associated with executing received commands and the second power state is associated with deactivating one or more components associated with a memory array;

initiating a second timer based at least in part on transitioning from the first power state to the second power state;

determining the second timer satisfies a threshold based at least in part on initiating the second timer, wherein the threshold is configurable based at least in part on a power performance target or a link target; and transitioning, based at least in part on determining the second timer satisfies the threshold, from the second power state to a third power state having a third current lower than the second current.

21. The method of claim 20, further comprising:

initiating the first timer based at least in part on transitioning from the second power state to the third power state;

determining the first timer satisfies a second threshold based at least in part on initiating the first timer; and transitioning from the third power state to a fourth power state having a fourth current lower than the third current based at least in part on determining the first timer satisfies the threshold, wherein the fourth power state is entered while a host system is in an idle state.

22. The method of claim 21, further comprising:
receiving a command associated with synchronizing a cache after transitioning from the third power state to the fourth power state;
transitioning from the fourth power state to the first power state based at least in part on receiving the command;
executing the command based at least in part on transitioning from the fourth power state to the first power state; and
transitioning from the first power state to a fifth power state having a fifth current equal to or less than the fourth current based at least in part on executing the command, wherein the fifth power state is associated with decoupling a voltage supply of the memory array.

23. The method of claim 21, further comprising:
receiving an access command after transitioning from the third power state to the fourth power state;
transitioning from the fourth power state to the first power state based at least in part on receiving the access command; and
executing the access command based at least in part on transitioning from the fourth power state to the first power state.

24. The method of claim 20, wherein the third power state comprises decoupling a clock signal from one or more components of a controller, deactivating an oscillator, and causing a random access memory of an apparatus to enter a sleep state.

* * * * *